United States Patent [19]
Armacost et al.

[11] Patent Number: 5,811,357
[45] Date of Patent: Sep. 22, 1998

[54] PROCESS OF ETCHING AN OXIDE LAYER

[75] Inventors: Michael D. Armacost, Wallkill; Tina J. Wagner, Newburgh; Michael L. Passow, Pleasant Valley; Dominic J. Schepis; Matthew J. Sendelbach, both of Wappingers Falls; William C. Wille, Poughkeepsie, all of N.Y.

[73] Assignee: International Business Machines Corporation, Armonk, N.Y.

[21] Appl. No.: 824,744

[22] Filed: Mar. 26, 1997

[51] Int. Cl.$^6$ .................................................. H01L 21/302
[52] U.S. Cl. .......................... 438/723; 438/695; 438/740
[58] Field of Search .................................. 438/695, 710, 438/723, 740, 743, 744

[56] References Cited

U.S. PATENT DOCUMENTS 4,324,611  4/1982  Vogel et al. ........................... 252/79.1
5,654,233  8/1997  Yu ............................................ 438/643

FOREIGN PATENT DOCUMENTS 58-214149  12/1983  Japan .

*Primary Examiner*—R. Bruce Breneman
*Assistant Examiner*—George Goudreau
*Attorney, Agent, or Firm*—Whitham, Curtis & Whitham; Alison Mortinger, Esq.

[57] ABSTRACT

A dry etching process for etching an oxide layer on a substrate in which a plasma is created in a gaseous mixture containing $C_4F_8$ and $C_2F_6$. The dry etch process is useful for etching an oxide layer stopping on a silicon nitride layer on a semiconductor wafer of an integrated circuit structure as it eliminates resist blistering without sacrificing high selectivity to nitride, via wall angle, and/or etch uniformity.

13 Claims, 3 Drawing Sheets

PROCESS OF ETCHING AN OXIDE LAYER

BACKGROUND OF THE INVENTION

1. Field of the Invention

The invention relates to the manufacturing of semiconductor devices and more particularly to an improved process for etching openings in oxide layers.

2. Description of the Related Art

Conventionally, in order to form metal contacts to semiconductor devices and active components thereof, such as gate contacts, source/drain diffusion region contacts, and/or strap contacts in logic applications, or bit line contacts in a DRAM, and so forth, a via or opening is etched through a dielectric layer so that an upper metal layer can be interconnected with a lower conductive layer. A conventional scheme for accomplishing this metallization involves forming a nitride etch stop layer on the feature which is to acquire a metal contact, followed by depositing a dielectric oxide layer, and then a photoresist is formed on the oxide layer which is imagewise-exposed and developed to define the desired pattern of openings to be etched through the underlying oxide layer. In order to form the contact openings, the oxide layer must be etched selectively to the underlying nitride etch stop layer. Then the exposed nitride layer is removed (e.g., by hot $H_3PO_4$), and then a liner (e.g., Ti/TiN) and contact metal (e.g., tungsten) is deposited in the openings followed by surface planarizing of the device and removal of the resist.

The step of selectively etching the oxide to nitride is conventionally performed by creating a plasma in an etching chamber in a fluorocarbon etchant gas that has a high C/F ratio, often in combination with hydrogen or carbon monoxide gas, where the fluorocarbon etching gas often is introduced as mixed with an inert carrier gas. The selectivity to nitride is generally achieved by mechanism of in-situ deposition of a polymer film on the patterned masking resist that defines the pattern of vias or openings in the oxide layer. The deposited polymer film ultimately causes a transition in the procedure from net etching to net deposition once the nitride layer becomes exposed. The amount of deposition of this polymer film on the resist during etching of the vias or openings is dependent on the particular exposed material. Specifically, the deposition is thinnest on the oxide layer material being etched, thicker on the exposed nitride, and thickest on the photoresist material used to define the contact openings. For certain advanced semiconductor applications, such as self-aligned contacts, octafluorocyclobutane ($C_4F_8$) gas is the only etchant gas that can provide adequate selectivity to nitride, which is thought attributable to the manner in which the cyclic $C_4F_8$ molecule breaks down and recombines as a polymer in a plasma.

However, in the high polymerizing chemistries used to achieve selectivity to nitride, such as pure $C_4F_8$, a drawback encountered is that the polymer deposited on the photoresist can form an impervious barrier to gas diffusion. In particular, the plasma by-products of pure $C_4F_8$ polymerize very efficiently, which, while responsible for the favorable high selectivity property of this gas, also is responsible for the creation of a very dense film of deposited polymer on the resist. This poses a problem because vapor is released either from the oxide or as a chemical by-product from the resist, or both, during the dry etch process. As a consequence, vapor pressure builds beneath the polymer film where it is trapped, and this gaseous build-up can only be released by explosive popping of the resist, resulting in blistering. Blistering refers to gross peeling of the resist from the wafer during a highly selective oxide etch. The resist blistering reduces process yield and final test yield in the semiconductor product, and contaminates the reactor. Also, while it was generally understood in the field that higher C/F ratios or inclusion of hydrogen-containing gases in the etchant mixture increase selectivity to nitride, those modifications would aggravate the resist blistering problem.

SUMMARY OF THE INVENTION

It is an object of the present invention to provide a dry etch process for etching an oxide layer on a substrate with high etch selectivity to the substrate.

It is another object of the present invention to provide a dry etch process for etching an oxide layer stopping on a silicon nitride layer on a semiconductor wafer of an integrated circuit structure which eliminates resist blistering without sacrificing high selectivity to nitride, via wall angle, and/or etch uniformity.

These and other objects, advantages, and benefits are achieved in the present invention by a dry etching process for etching an oxide layer on a substrate in which a plasma is created in a gaseous mixture containing $C_4F_8$ and $C_2F_6$. $C_4F_8$, i.e., octafluorocyclobutane, also is known by its refrigerant name Freon-C318. $C_2F_6$, i.e., perfluoroethane, also is known by its refrigerant name Freon-116.

The invention solves the resist blistering problem by generating a permeable polymer film on the photoresist during dry etching of an oxide layer, in which the permeable polymer film allows diffusion and outgassing of vapor molecules to relieve pressure build-up in the resist and thereby prevent resist blistering.

In one preferred embodiment of this invention, the dry etch process is used in the fabrication of integrated circuits using silicon nitride etch stop layers in the etching of vias or openings through a dielectric oxide using a patterned photoresist mask. The process is conducted in a reactive-ion etch reactor and employs a gaseous etchant mixture comprised of $C_4F_8$, $C_2F_6$, and a carrier gas (e.g., Ar, He, Ne, Kr, or Xe). In one preferred embodiment, the $C_4F_8$ and $C_2F_6$ are used in a $C_4F_8/C_2F_6$ mixing ratio, by volume, ranging from about 1/2 to about 3/1, respectively. In a preferred embodiment, the gaseous etchant mixture is comprised of 10 to 20 vol. % of the combined amount of $C_4F_8$ and $C_2F_6$ and 90 to 80 vol. % of inert gas.

The specific process parameters, such as RF power, substrate temperature, chamber pressure, and gas flow rate, effect the formation of a permeable (i.e., porous) polymer on silicon nitride but not on the oxide, thereby resulting in a high etch rate selectivity of the oxide over the nitride of about 20:1 without blistering of the resist. Moreover, desired selectivity requirements as between the oxide layer and the silicon nitride used as an etch stop are met by the present invention without tradeoff in other requirements such as the via wall angle.

Other advantages of the invention include avoidance of contamination to the workpiece and reactor from resist blistering. Additionally, the inventive process also produces a fluoropolymer film on the photoresist during the step of dry etching the oxide layer which has a low dielectric constant, for example, a K value of less than 2. Furthermore, the inventive etch process reduces the amount of polymer formed on the resist to help avoid resist delamination, while still providing the desired selectivity to nitride.

In addition to eliminating blistering, this invention also provides a technique for modulating the across wafer uniformity. With pure $C_4F_8$, the oxide etch rate profile for a patterned wafer was observed to be center fast. A pure $C_2F_6$ chemistry, on the other hand, demonstrates an edge fast uniformity rate. A combination of both chemistries, as used in this invention, gives a hybrid profile. Therefore, the plasma cracking patterns and flow dynamics of the different gases $C_4F_8$ and $C_2F_6$ can be used to control the uniformity pattern on the wafer. This pattern cannot usually be controlled strictly by gas chemistry alone, but requires some type of hardware modification. For instance, the gas delivery can be changed from a single nozzle to a shower head configuration. Therefore, with a proper gas flow ratio $C_4F_8$ and $C_2F_6$, the uniformity of the process can be enhanced.

For purposes of this invention, the terminology "silicon nitride" or "nitride" layer is used generally to refer to a layer of $Si_xN_y$, where x and y are each greater in value than zero and the ratio x:y may or may not be stoichiometric, as well as to various silicon oxynitride films ($Si_xN_yO_z$,). For instance, the silicon nitride can be $Si_3N_4$.

For purposes of this invention, the terminology "oxide-"layer is used generally to refer to a layer of silicon dioxide, and the silicon dioxide may undoped or doped, for example, with boron, phosphorus, or both, to form for example, borophosphosilicate glass (BPSG), and phosphosilicate glass (PSG). The silicon dioxide layers may be grown or deposited by conventional techniques.

For purposes of this invention, the terminology "resist," "photoresist," or "photosensitive layer" are used interchangeably and generally refer to film-forming materials sensitive to radiation, which alters their chemical properties sufficiently so that a pattern can be delineated in them. Positive or negative photoresist materials can be used in the practice of this invention.

As used herein, the terminology "opening" or "via " can refer to any type of opening through any type of oxide layer at any stage of processing.

These and other objects and features of the invention will become more fully apparent from the several drawings and description of the preferred embodiments.

DETAILED DESCRIPTION OF THE PREFERRED EMBODIMENTS OF THE INVENTION

Figure 1:
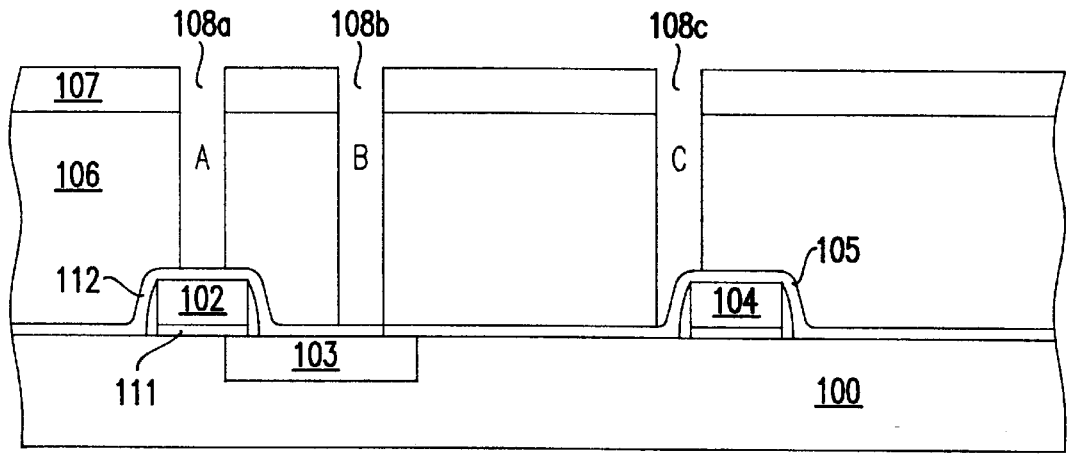
FIGS. 1 through 3 illustrate enlarged, cross-sectional views of a semiconductor structure having contacts formed for logic applications in accordance with the teachings of the present invention at various stages of processing.

Referring now to the drawings, and particularly FIG.'s 1–3, there is shown a representative portion of a semiconductor structure in enlarged views at several stages of fabrication of a logic device involving an oxide etch. The drawings are not necessarily to scale, as the thicknesses of the various layers are shown for visual clarity and should not be interpreted in a limiting sense unless otherwise indicated herein.

Referring to FIG. 1, a silicon substrate 100, a gate electrode 102, a source/drain diffusion region 103, and conductor 104 to be used for a strap contact, are shown. A gate insulating film 111 and sidewall spacers 112 are provided for the gate electrode 102 by conventional techniques. Other common elements of these logic devices that are not involved in oxide layer etch procedure of this invention are omitted to simplify the illustration. Also, the depiction of all these devices in a common figure is merely provided as part of an overview of the invention, as the principles of this invention can be applied independently to any one of these scenarios.

A silicon nitride layer 105 of approximately 500 to 750 Å thickness is deposited over the surface topography. The silicon nitride layer 105 can be formed by conventional methods such as plasma-enhanced chemical vapor deposition (PECVD). Next, an oxide layer 106 of approximately 9,000 to 12,000 Å total thickness is formed on silicon nitride layer 105. The silicon oxide layer can be formed by conventional methods such as CVD TEOS. The silicon oxide layer 106 also can contain impurities as BPSG, PSG, or ASSG. The thick oxide layer 106 may comprise one or more different oxide sublayers. For example, the oxide layer 106 could comprise an upper CVD TEOS oxide sublayer overlying a relatively thicker BPSG sublayer.

A photoresist layer 107 is coated on the oxide layer 106. The photoresist generally can have a thickness of about 5,000 to 7,000 Å. The photoresist layer 107, for example, can be a deep or mid U.V. photoresist material. The photoresist layer 107 can optionally be used in conjunction with a bottom antireflective layer. For instance, the photoresist layer 107 can be comprised of 6100 Å deep U.V. photoresist, such as APEX E, which is disposed over a of 900 Å thick bottom anti-reflective layer (not shown). The photoresist layer 107 is photolitho-graphically exposed and developed to define a pattern of openings 108a–c which correspond to the openings A, B and C to be formed in the oxide layer 106 in the ensuing oxide etch step.

As can be seen in FIG. 1, the unique dry etch process of this invention using a etching plasma derived from a combination of $C_4F_8$ and $C_2F_6$ gases is then conducted wherein the pattern of openings 108a–c formed in photoresist 107 is transferred to and completely through the oxide layer 106 stopping on silicon nitride layer 105 without the resist 107 experiencing blistering.

Figure 4:
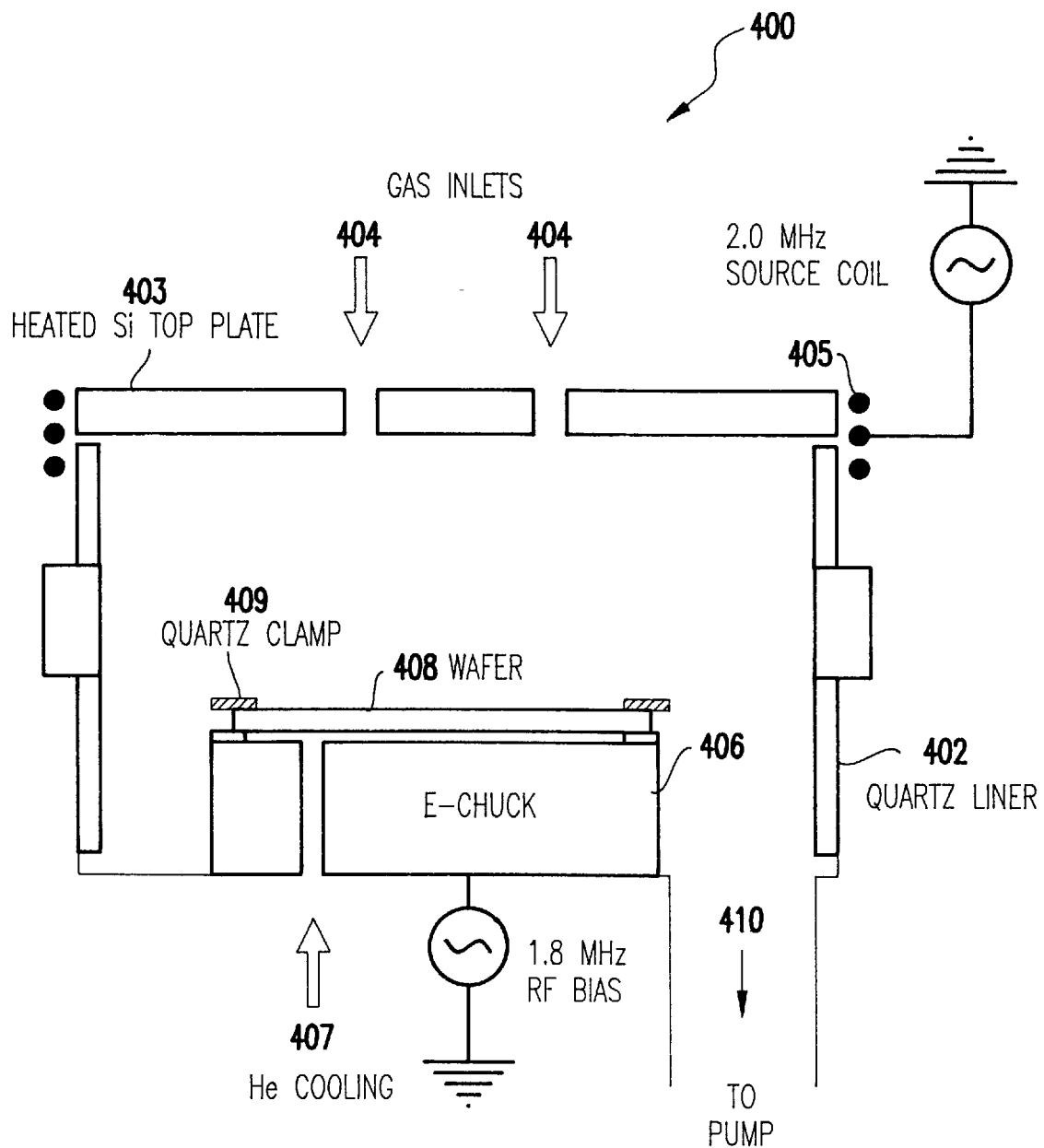
FIG. 4 is a schematic representation of a reactive ion etching system that may be employed in the practice of this invention.

The plasma generation apparatus that can be used for the reactive ion etching (RIE) operation for forming the openings A, B and C in the oxide layer 106 is not particularly limited. In a preferred embodiment schematically shown in FIG. 4, an Applied Materials plasma reactor 400 can be used to practice the oxide etch operation of this invention. The RIE apparatus 401 includes a vacuum container 402 having an inner quartz liner to define walls of the reaction chamber; a heated silicon top plate 403 at the roof of vacuum container 402 that includes gas inlets 404 for introducing etchant gas into the vacuum container 402 from a gas supply system (not shown); a 2.0 MHZ source coil 405; an E-chuck 406 installed within the vacuum container 402 having 1.8 MHZ RF bias provided with a temperature control mechanism including cooling piping 407 (e.g., helium cooling), and the E-chuck 406 also serves as a support for wafer workpiece 408 clamped thereon mechanically, such as with a quartz clamp 409, or by conventional electrostatic means (not shown), and so forth; and an exhaust system 410 connected to a pump (not shown) for creating a vacuum inside the vacuum container 402.

In operation, the etching gas mixture is introduced inside the vacuum container 402 and a high RF power is applied to excite the gas and generate the plasma. In one exemplary embodiment of this invention, gas flow rate, pressure, and applying power are adjusted in the following manner for carrying out etching of an oxide layer 106 using this equipment.

For the oxide etch procedure, the roof and wall temperatures of the reactor are 200° C. and 220° C., respectively. The oxide etch is carried out at a pressure of 5 millitorr, inductive/bias power of 1200/1400 W, and in a flow derived from a feed gas mixture of $C_4F_8$, $C_2F_6$, and inert gas (e.g., Ar, He, Ne, Kr, or Xe). In one preferred embodiment, the dry etching gas is a mixture of 5 sccm $C_4F_8$/ 5 sccm $C_2F_6$/150 sccm Ar. The openings A, B and C are etched through oxide layer 106 until the silicon nitride layer 105 is exposed.

However, in the case of SOI, it has been observed that the CMOS SOI wafers tend to exhibit increased blistering during this dry etching of the oxide layer as compared to bulk wafers. It is thought that the oxide layer portion of the SOI affects the wafer/chuck coupling, which likely causes the wafer to get hotter, and thereby aggravates blistering. The present investigators determined that this heightened blistering problem associated with SOI wafers could be countered by increasing the amount of the $C_2F_6$ component of the gas etchant mixture. Therefore, for SOI, a preferred flow is 5 sccm $C_4F_8$/10 sccm $C_2F_6$/150 sccm Ar.

Figure 2:
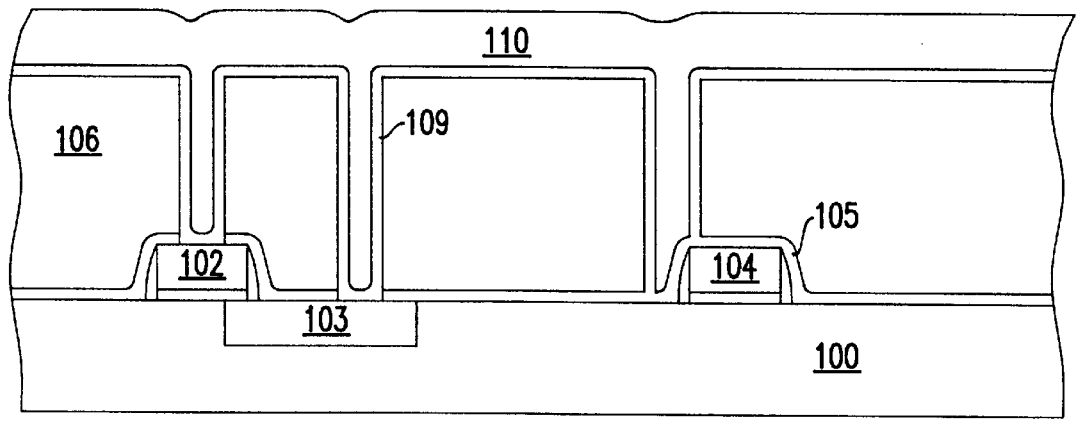
Figure 3:
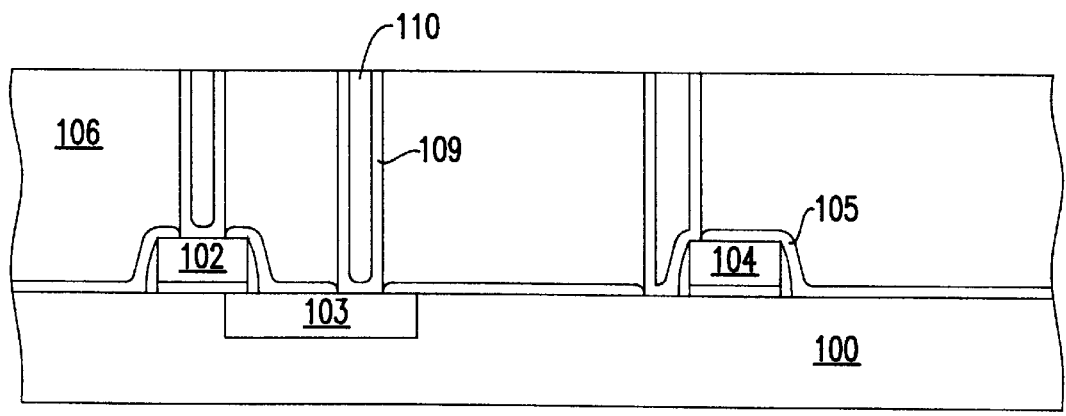

Once openings A, B, and C are formed in the oxide layer 106, the polymer film (not shown) formed on the surface of the resist layer during the oxide etch is removed. This can be done in situ with an oxygen plasma. The oxygen plasma employed for polymer film removal also can be used to remove the photoresist 107. Alternatively, the remaining resist 107 could be stripped by wet chemical etch, such as by use of sulfuric acid and/or nitric acid. Then the portions of nitride layer 105 exposed at the bottom of the openings A, B and C are removed (e.g., by hot $H_3PO_4$). As shown in FIG. 2, a liner 109 (e.g., Ti/TiN) and contact metal 110 (e.g., tungsten) are then sequentially deposited in the openings A, B, C. The formation of the first level of metallization is completed by planarizing the device, e.g., by CMP, to remove the deposited metal from planar surfaces of the oxide layer 106 to form metal contacts in openings A, B, and C to the underlying devices.

Figure 5:
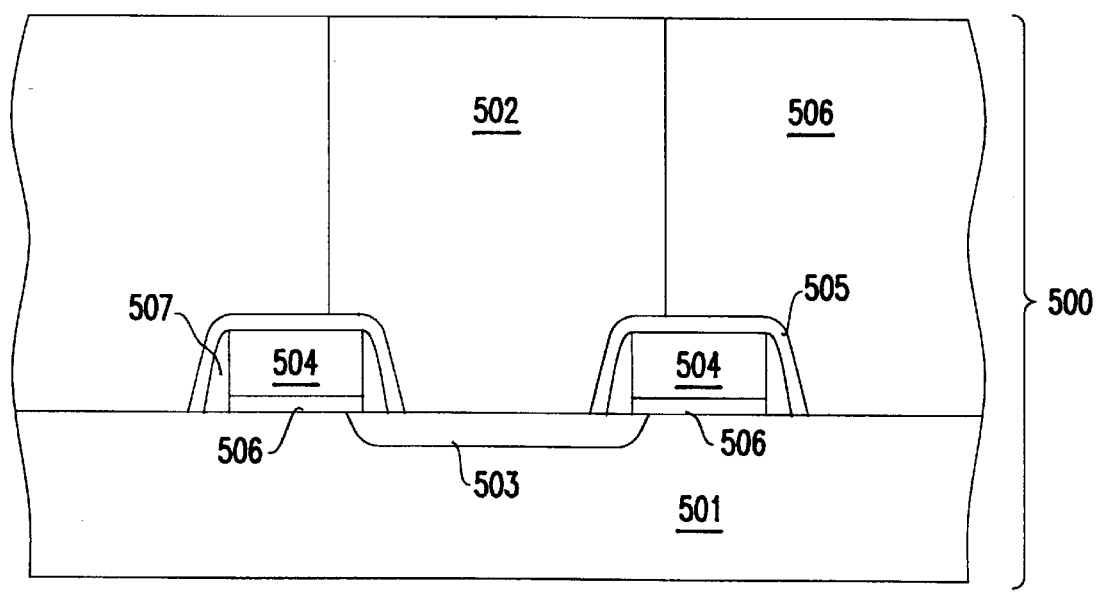
FIG. 5 illustrates an enlarged, cross-sectional view of a DRAM device having a bit line formed in accordance with the teachings of the present invention.

As shown in FIG. 5, the principles of this invention also can be applied in forming a bit line 502 for a DRAM device 500. The DRAM 500 has gate electrode 504 coated on silicon substrate 501 via a gate insulating film 506, where sidewall spacers 507 are formed on the lateral sides of the gate electrodes in a conventional manner. Silicon nitride 505 having a thickness of about 100 to 500 Å is formed on the gate electrode 504. In a conventional manner, the gate electrode is used as a mask to form source/drain diffusion 503. A thick oxide film 506 having a thickness of about 5,000 to 10,000 Å is formed as an interlayer to which dry etching with $C_4F_8$ and $C_2F_6$ is performed by a photoresist pattern (not shown) in the manner described above, where the silicon nitride layer 505 acts as the etch stop layer. The oxide layer 506 can be a composite oxide of 3,000 Å TEOS over 5,000 Å BPSG. The resist does not incur blistering in the fabrication of the DRAM 500 because of the addition of the $C_2F_6$ to the etchant gas containing $C_4F_8$.

It should understood that the plasma for the oxide etch step can be generated either in the etch chamber itself or outside the etch chamber at some point in communication with the etch chamber, e.g., a plasma generated in a microwave cavity upstream of the etch chamber in the gas flow stream so that reactive species produced in such a plasma will flow into the etch chamber.

While not desiring to be bound by any particular theory at this time, it nonetheless is believed that the addition of $C_2F_6$ to the $C_4F_8$ dry etch chemistry changes the polymer precursors in the plasma, and this accounts for the result that the polymer film is more permeable (i.e., porous). The elimination of blistering in the photoresist during the oxide etch has been verified in this invention by observation via scanning electron micrographs (SEM).

Furthermore, pattern factor also has been found to be important in the polymer formation-outgassing mechanism associated with RIE etching of an oxide layer with C/F chemistry. It has been found that blistering tends to occur more as the pattern factor decreased, blanket resist being the worst. This is thought attributable to the fact that less sidewalls are available from which outgassing can escape. To account for this, the amount of $C_2F_6$ can be adjusted for any pattern factor. For example, the amount of $C_2F_6$ can be increased with decreasing pattern factor.

While the invention has been described in terms of several preferred embodiments, those skilled in the art will recognize that many steps described above can be altered and that material substitutions can be freely made without departing from the spirit and scope of the invention.

What is claimed is:

1. A dry etch process for etching an oxide layer on a silicon nitride substrate, comprising creating a plasma in a gas etchant mixture comprising $C_4F_8$ and $C_2F_6$.

2. The process of claim 1, wherein said gas etchant mixture further comprises an inert carrier gas.

3. A dry etch process for etching an oxide layer stopping on a silicon nitride layer on a semiconductor wafer of an integrated circuit structure, comprising creating a plasma in a gas etchant mixture comprising 10 to 20 vol. % combined amount of $C_4F_8$ and $C_2F_6$, and 90 to 80 vol. % of an inert gas, wherein said $C_4F_8$ and $C_2F_6$ are present in a $C_4F_8/C_2F_6$ ratio, by volume, of about 1/2 to about 3/1.

4. A dry etch process for etching an oxide layer stopping on a substrate on a semiconductor wafer of an integrated circuit structure, comprising the steps of:
   forming a photosensitive layer on said oxide layer which is on said substrate;
   forming an opening in said photosensitive layer to expose a surface portion of said oxide layer;
   forming a plasma in a gas etchant mixture containing $C_4F_8$ and $C_2F_6$ to etch a via opening in said exposed surface portion of said oxide layer sufficient to expose said substrate and form a polymer layer on said photosensitive layer.

5. The process of claim 4, wherein said substrate is silicon nitride.

6. The process of claim 5, wherein said silicon nitride layer is disposed on a corner of a structure, wherein said oxide layer opening exposes said nitride layer on said corner of said structure.

7. The process of claim 6, wherein said structure is a gate electrode.

8. The process of claim 4, wherein said gas etchant mixture comprises 10 to 20 vol. % combined amount of $C_4F_8$ and $C_2F_6$, and 90 to 80 vol. % of an inert gas, wherein said $C_4F_8$ and $C_2F_6$ are present in a $C_4F_8/C_2F_6$ ratio, by volume, of about 1/2 to about 3/1.

9. The process of claim 4, wherein said $C_4F_8$ and $C_2F_6$ are present in a $C_4F_8/C_2F_6$ ratio, by volume, of about 1/1.

10. The process of claim 4, wherein said oxide layer is selected from the group consisting of silicon dioxide, BPSG, and PSG.

11. The process of claim 4, wherein said photosensitive layer is a U.V. photoreactive material.

12. The process of claim 4, further comprising the step of depositing a metal in said opening.

13. The process of claim 4, further comprising the steps of:
   removing said photosensitive layer to expose planar surfaces of said oxide layer;
   depositing a metal in said opening and on said planar surfaces of said oxide layer; and
   planarizing to remove said deposited metal from said planar surfaces of said oxide layer.

* * * * *